(12) United States Patent
Miyamoto

(10) Patent No.: US 7,528,891 B2
(45) Date of Patent: May 5, 2009

(54) DIGITAL SIGNAL TRANSMISSION SYSTEM AND METHOD, TRANSMISSION APPARATUS AND METHOD, AND RECEPTION APPARATUS AND METHOD

(75) Inventor: Masaru Miyamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 509 days.

(21) Appl. No.: 10/524,994

(22) PCT Filed: Aug. 21, 2003

(86) PCT No.: PCT/JP03/10546

§ 371 (c)(1),
(2), (4) Date: Mar. 10, 2006

(87) PCT Pub. No.: WO2004/019546

PCT Pub. Date: Mar. 4, 2004

(65) Prior Publication Data

US 2006/0209969 A1    Sep. 21, 2006

(30) Foreign Application Priority Data

Aug. 21, 2002 (JP) ............................. 2002-240041

(51) Int. Cl.
*H04N 7/08* (2006.01)
*H03L 7/06* (2006.01)
(52) U.S. Cl. ...................................... 348/723; 327/159
(58) Field of Classification Search ................. 348/723, 348/423.1, 515, 537, 738; 327/217, 159, 327/115, 117
See application file for complete search history.

(56) References Cited

U.S. PATENT DOCUMENTS

| 5,703,537 | A | | 12/1997 | Bland et al. |
| 5,703,557 | A | * | 12/1997 | Osada et al. ................... 336/92 |
| 6,049,769 | A | * | 4/2000 | Holmes et al. .............. 704/278 |
| 6,151,479 | A | * | 11/2000 | Kummer ....................... 725/70 |
| 6,404,249 | B2 | * | 6/2002 | Hayashida .................. 327/159 |
| 6,549,765 | B2 | * | 4/2003 | Welland et al. ............. 455/260 |
| 7,088,398 | B1 | * | 8/2006 | Wolf et al. ............... 348/423.1 |
| 7,180,349 | B2 | * | 2/2007 | Leifso et al. ................ 327/217 |

FOREIGN PATENT DOCUMENTS

EP            0 500 516            8/1992

(Continued)

*Primary Examiner*—Paulos M Natnael
(74) *Attorney, Agent, or Firm*—Frommer Lawrence & Haug LLP; William S. Frommer; Thomas F. Presson

(57) ABSTRACT

An AV signal transmission/reception apparatus and a digital signal transmission system and method. A reception apparatus and method that can reproduce an audio reference clock of a plurality of different frequencies from a video reference clock. A pixel clock is divided by a divider into a signal of a constant frequency for phase comparison by a phase comparator. A sample frequency (Fs) decoder determines division ratio information based on Fs information representing the frequency of an audio clock transmitted from a transmission unit. The division ratio information is supplied to a first variable divider and a second variable divider. As a result, even if the frequency of the audio clock changes, the oscillation frequency of the a VCO unit can be kept constant, and the second variable divider can output a signal of a constant frequency for keeping constant the frequency of the signal transmitted to the phase comparator.

8 Claims, 6 Drawing Sheets

FOREIGN PATENT DOCUMENTS

| | | |
|---|---|---|
| EP | 0 844 738 | 5/1998 |
| EP | 0 936 742 | 8/1999 |
| JP | 5-199498 | 8/1993 |
| JP | 6 29945 | 4/1994 |
| JP | 9-284126 | 10/1997 |
| JP | 10 290378 | 10/1998 |
| JP | 11-191759 | 7/1999 |
| JP | 2000-350119 | 12/2000 |
| JP | 2001-127626 | 5/2001 |
| JP | 2001-244923 | 9/2001 |
| JP | 2002-217716 | 8/2002 |

* cited by examiner

FIG. 3

| Fs | P | Q |
|---|---|---|
| 96kHz | 1 | 6 |
| 48kHz | 2 | 3 |
| 32kHz | 3 | 2 |

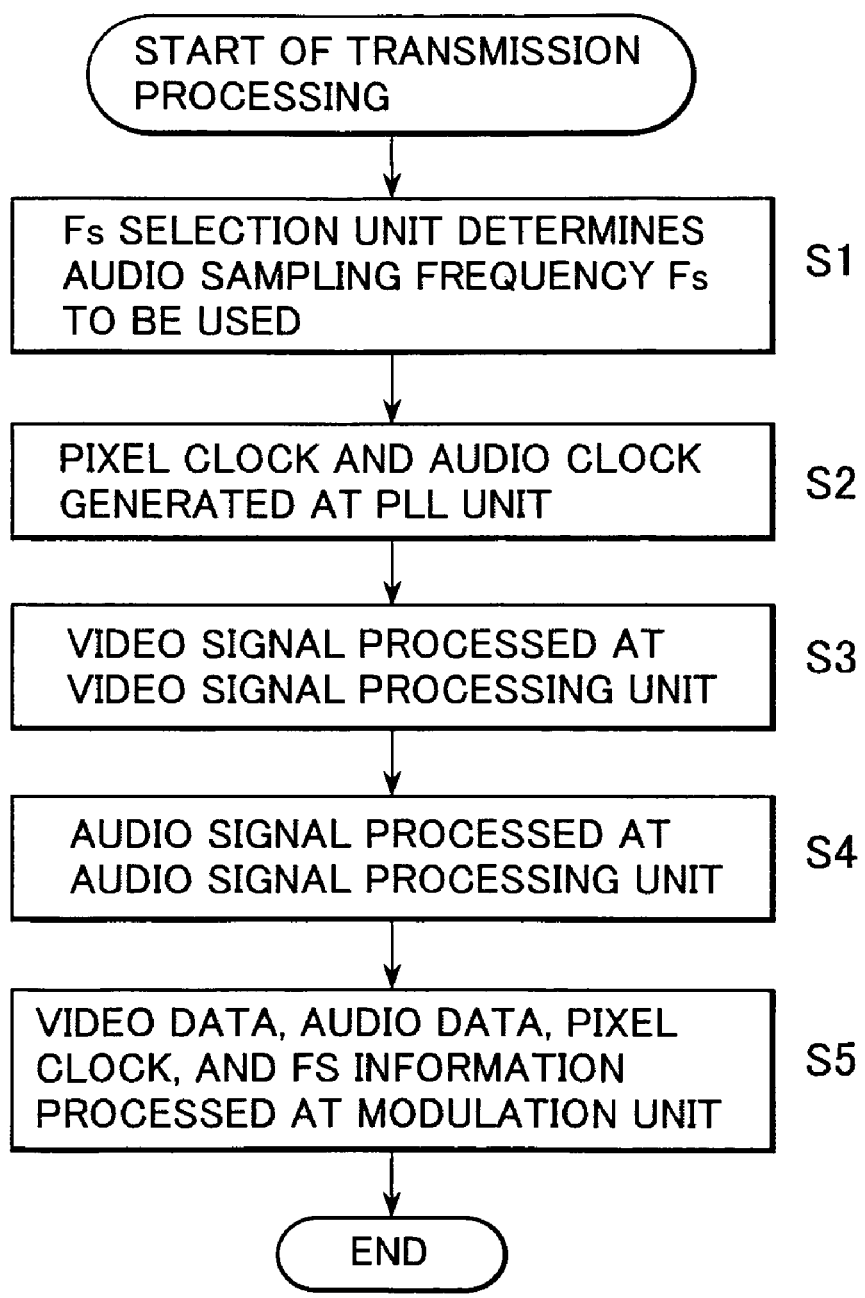

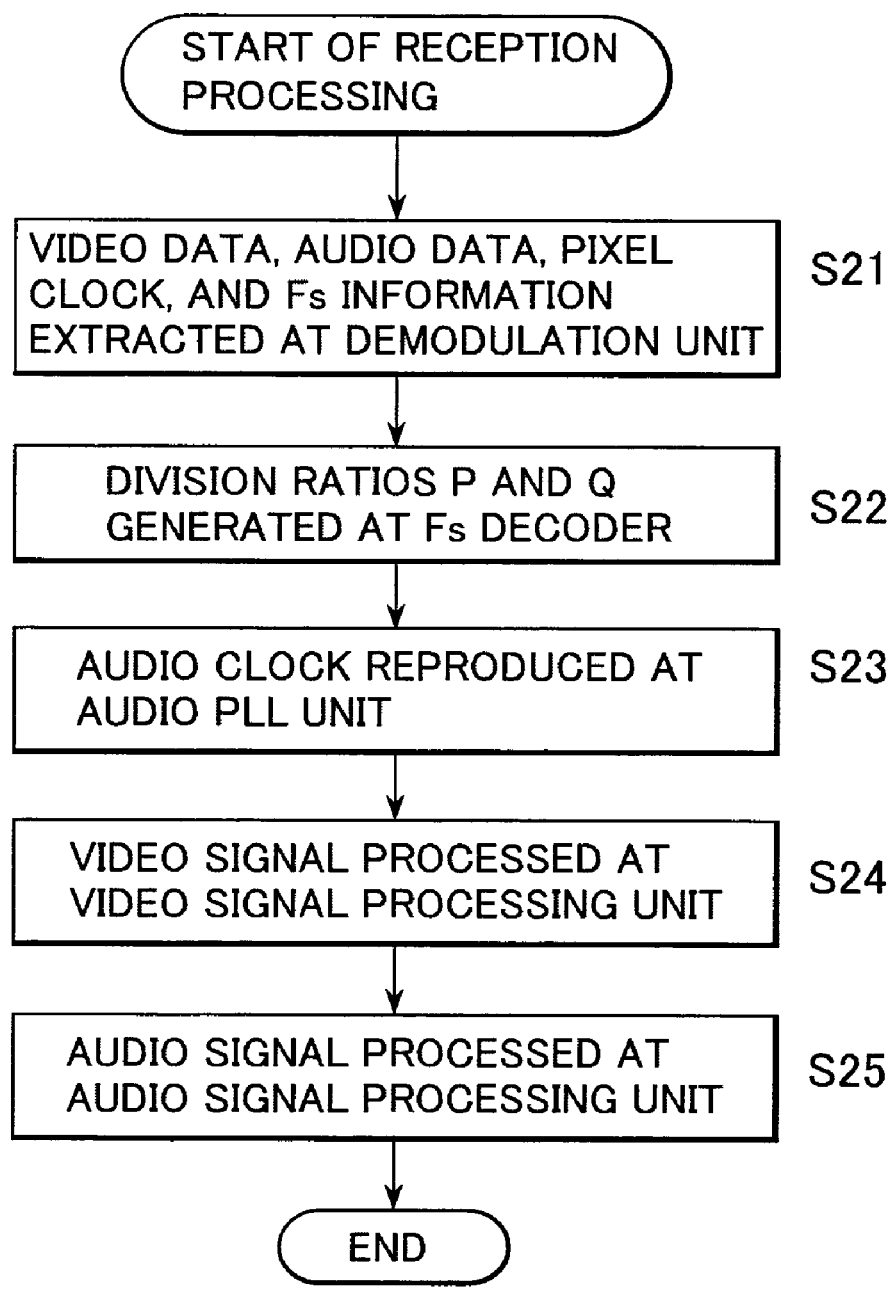

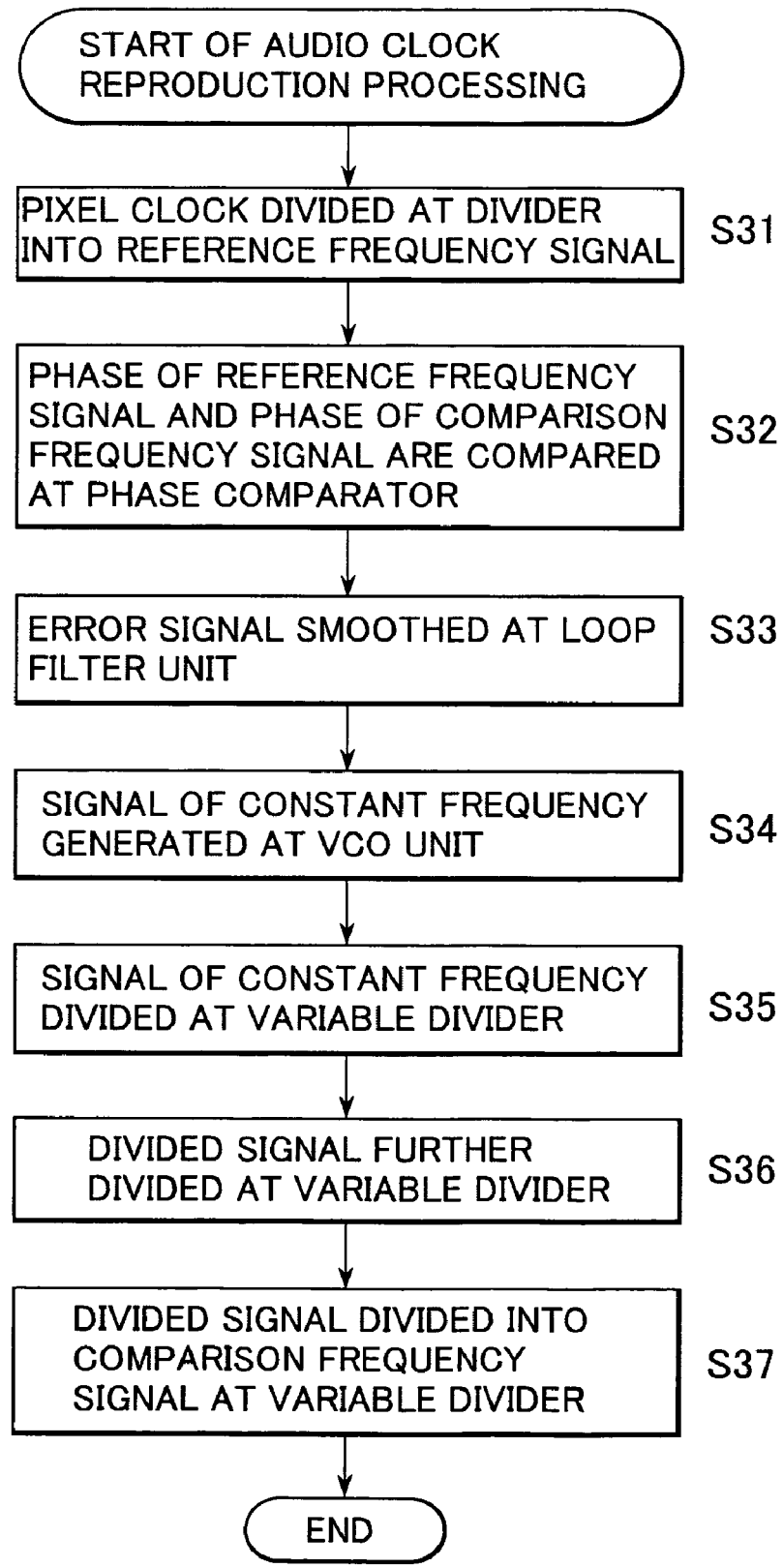

DIGITAL SIGNAL TRANSMISSION SYSTEM AND METHOD, TRANSMISSION APPARATUS AND METHOD, AND RECEPTION APPARATUS AND METHOD

TECHNICAL FIELD

The present invention relates to a digital signal transmission system and method, a transmission apparatus and method, and a reception apparatus and method, and more particularly to a digital signal transmission system and method, a transmission apparatus and method, and a reception apparatus and method advantageously used for an apparatus that reproduces an audio reference clock from a video reference clock.

BACKGROUND ART

When signals such as digital video signals and digital audio signals, for example, are transmitted from a transmission apparatus to a reception apparatus, the reception apparatus side must reproduce a video reference clock for processing the digital video signal and an audio reference clock for processing the digital audio signal.

The frequency of the audio reference clock may differ depending on the audio signal that is transmitted. In such a case, a plurality of PLL (Phase Locked Loop) circuits, one for each frequency, have been conventionally provided in the reception apparatus to reproduce audio reference clocks of different frequencies. This results in the problem of complex configuration, large apparatus size, and high costs.

DISCLOSURE OF THE INVENTION

The present invention has been conceived in view of the foregoing and aims at making it possible to reproduce a clock of a plurality of frequencies through a simple configuration.

A digital signal transmission system according to the present invention is characterized in that the transmission apparatus includes clock generating means for generating a first clock and a second clock; frequency information outputting means for outputting frequency information related to a frequency of the first clock; first signal processing means for processing a first signal and outputting a first digital signal based on the first clock generated by the clock generating means; second signal processing means for processing a second signal and outputting a second digital signal based on the second clock generated by the clock generating means; and transmitting means for transmitting the second clock generated by the clock generating means, the frequency information output by the frequency information outputting means, the first digital signal output by the first signal processing means, and the second digital signal output by the second signal processing means, and the reception apparatus includes receiving means for receiving the signals transmitted by the transmitting means; division ratio information generating means for generating division ratio information, which represents a division ratio, based on the frequency information extracted from the signals received by the receiving means; and clock reproducing means for reproducing the first clock based on the second clock extracted from the signals received by the receiving means and the division ratio information.

A digital signal transmission method according to the present invention is characterized in that a transmission method of the transmission apparatus includes a clock generating step of generating a first clock and a second clock; a frequency information outputting step of outputting frequency information related to a frequency of the first clock; a first signal processing step of processing a first signal and outputting a first digital signal based on the first clock generated by the processing of the clock generating step; a second signal processing step of processing a second signal and outputting a second digital signal based on the second clock generated by the processing of the clock generating step; and a transmitting step of transmitting the second clock generated by the processing of the clock generating step, the frequency information output by the processing of the frequency information outputting step, the first digital signal output by the processing of the first signal processing step, and the second digital signal output by the processing of the second signal processing step, and a reception method of the reception apparatus includes a receiving step of receiving the signals transmitted by the processing of the transmitting step; a division ratio information generating step of generating division ratio information, which represents a division ratio, based on the frequency information extracted from the signals received by the processing of the receiving step; and a clock reproducing step of reproducing the first clock based on the second clock extracted from the signals received by the processing of the receiving step and the division ratio information.

According to the digital signal transmission system and method of the present invention, in the transmission apparatus side, the first clock and the second clock are generated, the frequency information related to the frequency of the first clock is output, the first signal is processed based on the generated first clock and the frequency information, and the second signal is processed based on the generated second clock. The second clock, the frequency information, the processed first digital signal, and the processed second digital signal are transmitted to the reception apparatus. In the reception apparatus side, the division ratio information, which represents a division ratio, is generated based on frequency information extracted from the received signals, and the first clock is reproduced based on the second clock extracted from the received signals and the division ratio information.

A transmission apparatus according to the present invention is characterized by comprising clock generating means for generating a first clock and a second clock; frequency information outputting means for outputting frequency information related to a frequency of the first clock; first signal processing means for processing a first signal and outputting the first digital signal based on the first clock generated by the clock generating means; second signal processing means for processing a second signal and outputting the second digital signal based on the second clock generated by the clock generating means; and transmitting means for transmitting the second clock generated by the clock generating means, the frequency information output by the frequency information outputting means, the first digital signal output by the first signal processing means, and the second digital signal output by the second signal processing means.

A transmission method according to the present invention is characterized by comprising a clock generating step of generating a first clock and a second clock; a frequency information outputting step of outputting frequency information related to a frequency of the first clock; a first signal processing step of processing a first signal and outputting the first digital signal based on the first clock generated by the processing of the clock generating step; a second signal processing step of processing a second signal and outputting the second digital signal based on the second clock generated by the processing of the clock generating step; and a transmitting step of transmitting the second clock generated by the processing of the clock generating step, the frequency information output by the processing of the frequency information outputting step, the first digital signal output by the processing of the first signal processing step, and the second digital signal output by the processing of the second signal processing step.

According to the transmission apparatus and method of the present invention, the first clock and the second clock are generated, frequency information related to the frequency of the first clock is output, the first signal is processed based on the generated first clock and the frequency information, and the second signal is processed based on the second clock. The second clock, the frequency information, the processed first digital signal, and the processed second digital signal are transmitted.

A reception apparatus according to the present invention is characterized by comprising receiving means for receiving the first digital signal, the second digital signal, the frequency information related to a first clock, and a signal including a second clock, all of which are transmitted by a transmission apparatus; division ratio information generating means for generating division ratio information, which represents a division ratio, based on the frequency information extracted from the signals received by the receiving means; and clock reproducing means for reproducing the first clock based on the second clock received by the receiving means and the division ratio information generated by the division ratio information generating means.

The clock reproducing means can include a first dividing means for dividing the second clock, which is extracted from the signals received by the receiving means, by a first division ratio for generating a signal of a reference frequency; phase comparing means for comparing the phase of the signal of a reference frequency, generated by the first dividing means, with the phase of a signal of a comparison frequency and outputting a phase error signal; smoothing means for smoothing the error signal output by the phase comparing means; oscillating means for oscillating a signal of a constant frequency controlled based on an output from the smoothing means; a second dividing means for dividing the signal of a constant frequency, oscillated by the oscillating means, by a second division ratio based on the division ratio information generated by the division ratio generating means; a third dividing means for dividing the signal, generated by the second dividing means, by a third division ratio based on the division ratio information generated by the division ratio information generating means; and a fourth dividing means for dividing the signal, generated by the third dividing means, by a fourth division ratio for generating the signal of a comparison frequency.

A reception method according to the present invention is characterized by comprising a receiving step of receiving the first digital signal, the second digital signal, frequency information related to a first clock, and a signal including a second clock, all of which are transmitted by a transmission apparatus; a division ratio information generating step of generating division ratio information, which represents a division ratio, based on the frequency information extracted from the signals received by the processing of the receiving step; and a clock reproducing step of reproducing the first clock based on the second clock received by the processing of the receiving step and the division ratio information generated by the processing of the division ratio information generating step.

The clock reproducing step can include a first dividing step of dividing the second clock, which is extracted from the signals received by the processing of the receiving step, by a first division ratio for generating a signal of a reference frequency; a phase comparing step of comparing the phase of the signal of a reference frequency, generated by the processing of the first dividing step, with the phase of a signal of a comparison frequency and generating a phase error signal; a smoothing step of smoothing the error signal generated by the processing of the phase comparing step; an oscillating step of oscillating a signal of a constant frequency based on the signal smoothed by the processing of the smoothing step; a second dividing step of dividing the signal of a constant frequency, oscillated by the processing of the oscillating step, by a second division ratio based on the division ratio information generated by the processing of the division ratio generating step; a third dividing step of dividing the signal, generated by the processing of the second dividing step, by a third division ratio based on the division ratio information generated by the processing of the division ratio generating step; and a fourth dividing step of dividing the signal, generated by the processing of the third dividing step, by a fourth division ratio for generating the signal of a comparison frequency.

According to the reception apparatus and method of the present invention, the division ratio information representing a division ratio is generated based on the frequency information extracted from the received signals, and the first clock is reproduced based on the received second clock and the division ratio information.

BRIEF DESCRIPTION OF DRAWINGS

FIG. 3 is a diagram showing a combination of a sampling frequency and a division ratio.

FIG. 4 is a flowchart showing the transmission processing of the transmission apparatus shown in FIG.

FIG. 5 is a flowchart showing the reception processing of the reception apparatus shown in FIG.

FIG. 6 is a flowchart showing the operation of the audio PLL unit shown in FIG. 2.

BEST MODE FOR CARRYING OUT THE INVENTION

Figure 1:
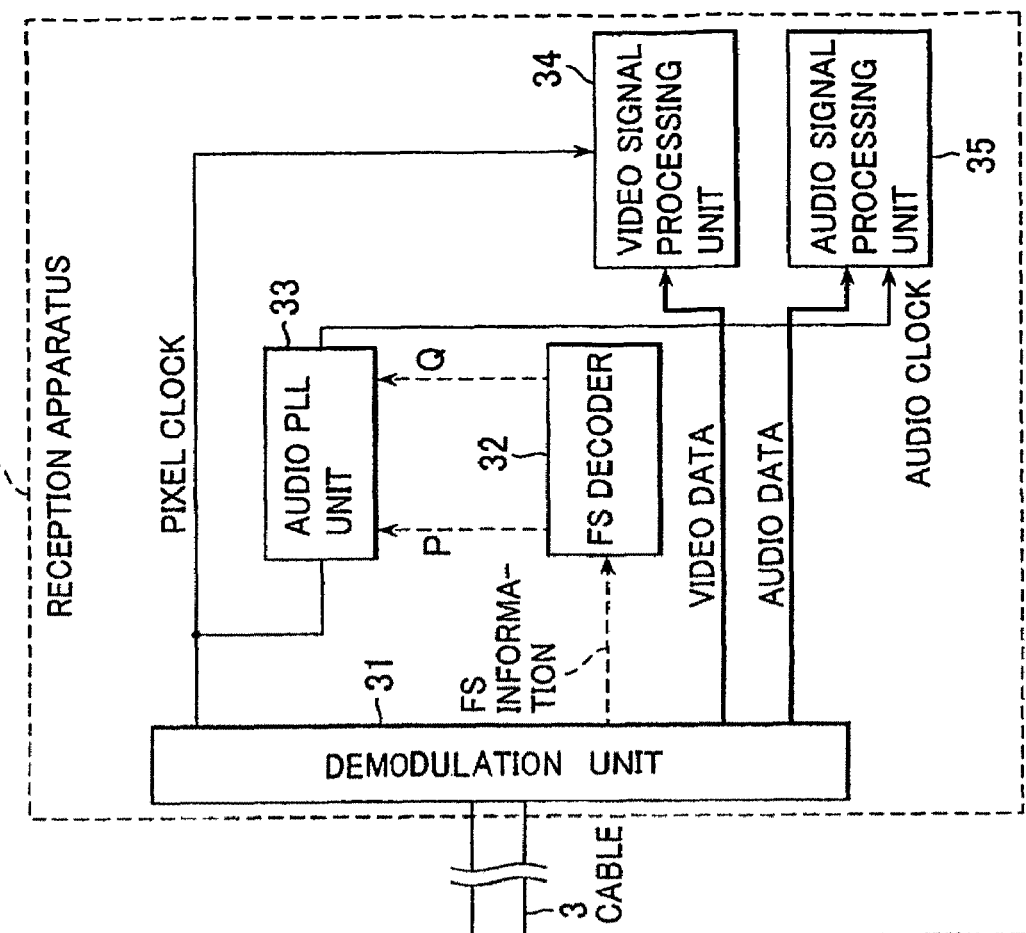
FIG. 1 is a block diagram showing the configuration of one embodiment of a digital signal transmission system to which the present invention is applied.
Figure 1:
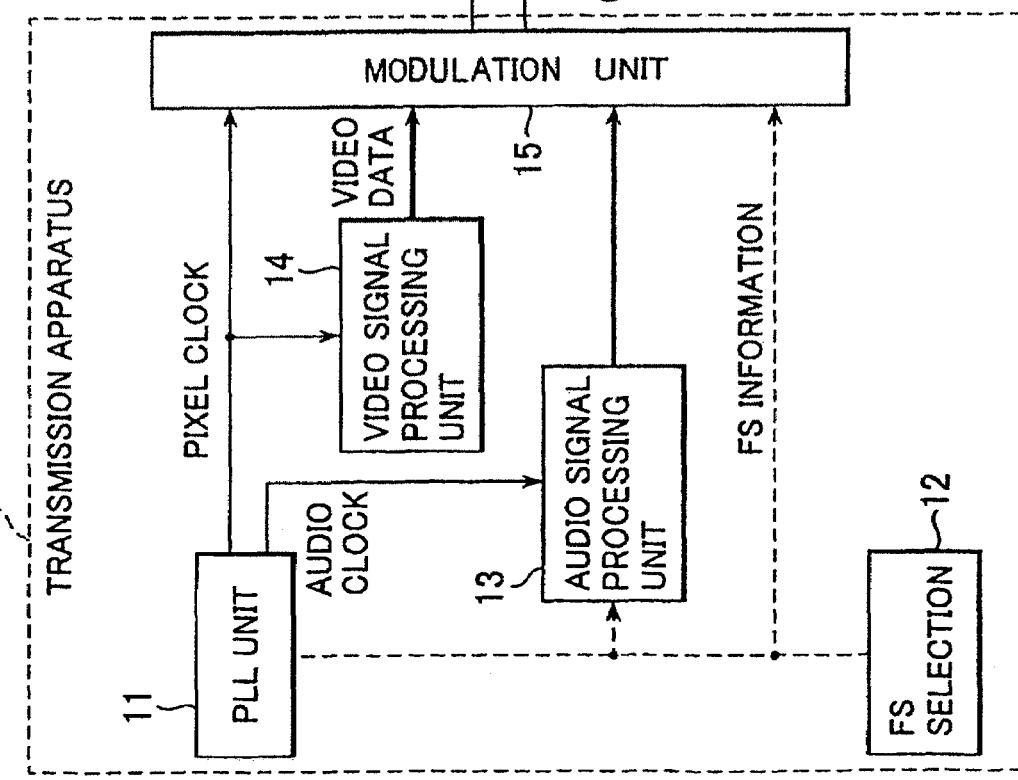

An embodiment of the present invention will be described below with reference to the drawings. FIG. 1 shows a configuration of an embodiment of a digital signal transmission system according to the present invention. By the way, the word system refers to a logical collection of a plurality of apparatuses but does not need to contain all apparatuses in a same housing. As shown in the figure, a transmission apparatus 1 that transmits a digital signal is connected to a reception apparatus 2 that receives the digital signal via a cable 3 in this system. The transmission apparatus 1 is constituted by a set-top box, a DVD (Digital Versatile/Video Disk) player, etc., and the reception apparatus 2 is constituted by a television tuner, a monitor, etc.

The transmission apparatus 1 includes a PLL (Phase Locked Loop) unit 11 that generates a pixel clock and an audio clock and an Fs selection unit 12 that selects a sampling frequency Fs and outputs Fs information that is the information related to the sampling frequency Fs. The transmission apparatus 1 further includes an audio signal processing unit 13 that processes an audio signal and outputs digital audio data and a video signal processing unit 14 that processes a video signal and outputs digital video data. The transmission apparatus 1 further includes a modulation unit 15 that modulates and transmits the pixel clock, the Fs information, the digital audio data, and the digital video data.

The reception apparatus 2 includes a demodulation unit 31 that receives and demodulates a signal transmitted from the transmission apparatus 1 and outputs the pixel clock, the Fs information, the audio data, and the video data. The reception apparatus 2 further includes an Fs decoder 32 that generates division ratio information values P and Q based on the Fs information extracted from the demodulation unit 31 and an audio PLL unit 33 that reproduces the audio clock from the pixel clock, extracted from the demodulation unit 31, based on the values P and Q. The reception apparatus 2 further includes a video signal processing unit 34 that processes the digital video data and an audio signal processing unit 35 that processes the digital audio data.

Figure 2:
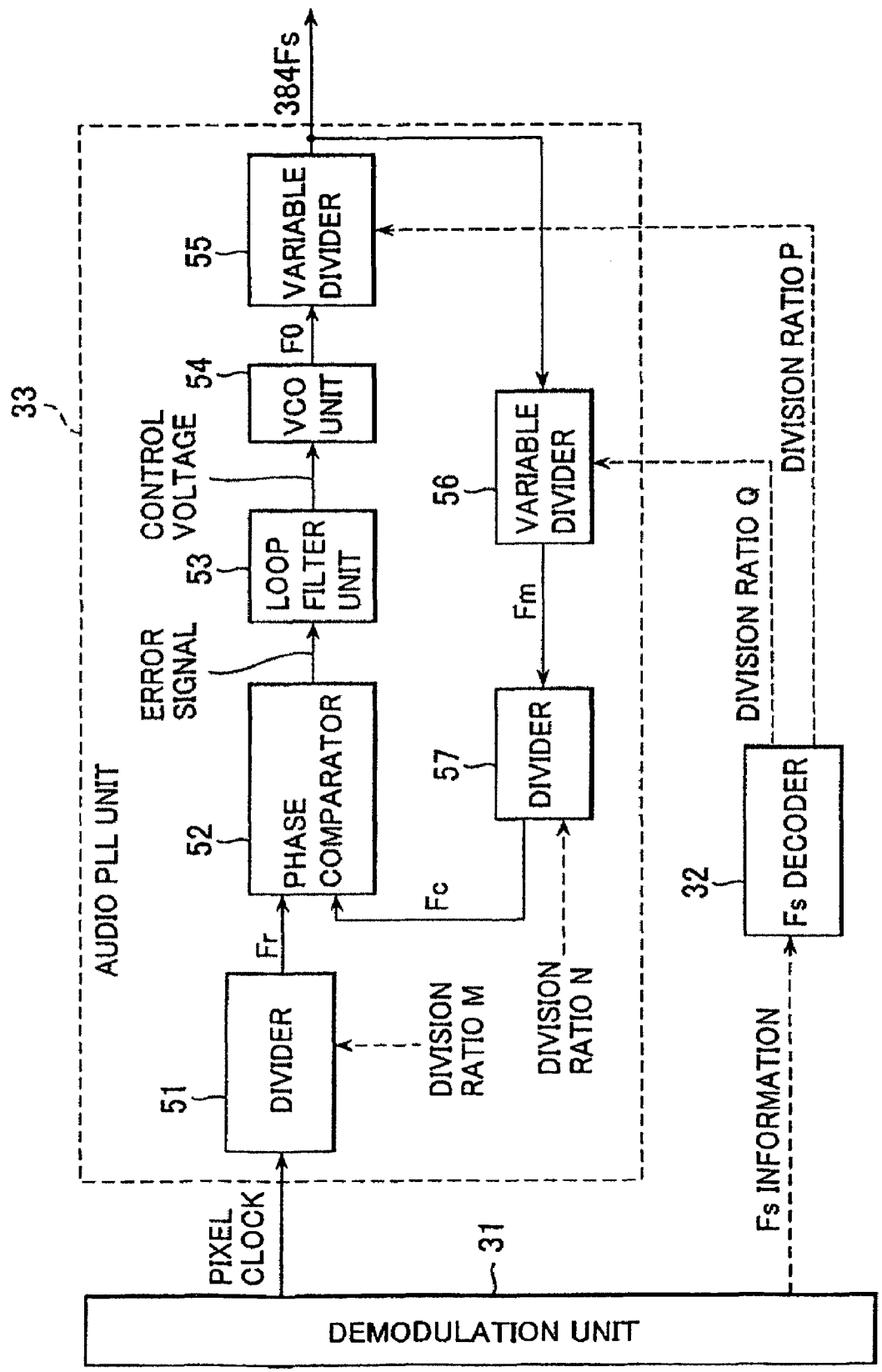
FIG. 2 is a block diagram showing the configuration of the audio PLL unit shown in FIG. 1.

The audio PLL unit 33 is configured as shown in FIG. 2. The audio PLL unit 33 includes a divider 51 that divides the pixel clock extracted from the demodulation unit 31 and outputs the reference frequency signal Fr and a phase comparator 52 that compares the phase of the reference frequency signal Fr with the phase of the comparison frequency signal Fc to output a phase error signal. The audio PLL unit 33 further includes a loop filter unit 53 that smoothes the error signal output from the phase comparator 52 and a VCO (Voltage Controlled Oscillator) unit 54 that generates a signal Fo of a constant frequency controlled based on the control voltage output from the loop filter unit 53.

In the description below, Fr, Fc, and Fo are used as symbols representing signal types as well as symbols representing the corresponding frequencies. Other signals are represented in the same way.

In addition, the audio PLL unit 33 further includes a variable divider 55 that divides the signal Fo, output from the VCO unit 54, based on the value P output from the Fs decoder 32 and outputs the audio clock of 384Fs frequency; and a variable divider 56 that divides the audio clock of 384Fs frequency based on the value Q, output from the Fs decoder, and outputs the signal Fm of a constant frequency. The audio PLL unit 33 further includes a divider 57 that devices the signal Fm and outputs the signal Fc of the comparison frequency.

Assuming that different sampling frequency values FS are represented by Fs1, Fs2, Fs3, and so on, if the frequency of the signal Fo is 384 times of the common multiple of the sampling frequencies Fs1, Fs2, Fs3, and so on, the values of signal Fo a384Fs1, b384Fs2, c384Fs3, and so on become equal. In other words, the relation a384Fs1=b384Fs2=c384Fs3 . . . (a, b, c, . . . are positive integers) is satisfied. In this case, when the values of the frequency Fo are divided by a, b, c, and so on respectively, the resulting values are 384Fs1, 384Fs2, 384Fs3, and so on, respectively.

In other words, by selecting the ratio of each 384Fs to its common multiple Fo, such as a, b, c, and so on, as the division ratio P of the variable divider 55, the frequency Fo can be kept constant regardless of the sampling frequency Fs.

In addition, if the frequency Fm is 384 times of the common divisor of the frequencies Fs1, Fs2, Fs3, and so on, the relations 384Fs1=lFm, 384Fs2=mFm, 384Fs3=nFm, and so on (l, m, n, . . . are positive integers) are satisfied. In this case, when 384Fs1, 384Fs2, 384Fs3, and so on are divided by l, m, n, and so on, the result is Fm.

By selecting the ratio of 384Fs1, 384Fs2, 384Fs3, and so on to its common divisor Fm, such as l, m, n, and so on, as the division ratio Q of the variable divider 56, Fm can be kept constant regardless of Fs.

An example of actual numeric values is used in the description below. Assume that the pixel clock is 27 MHz, the division ratio (fixed) of the divider 51 is 27000, the division ratio (fixed) of the divider 57 is 6144, the frequency of the reference frequency signal Fr is 1 kHz, and the frequency of the comparison frequency signal Fc is 1 kHz. Assume that the sampling frequency Fs is one of three: 96 kHz, 48 kHz, and 32 kHz. Assume that the frequency of the signal Fo generated by the VCO unit 54 is 36.864 MHz in other words 384 times of the least common multiple (96 kHz) of the three kinds of Fs. Assume that the frequency of the signal Fm output from the variable divider 56 is 6.144 MHz that is the greatest common measure of the 384 times (36.864 MHz, 18.432 MHz, and 12.288 MHz) of three sampling frequencies Fs.

Figure 3:
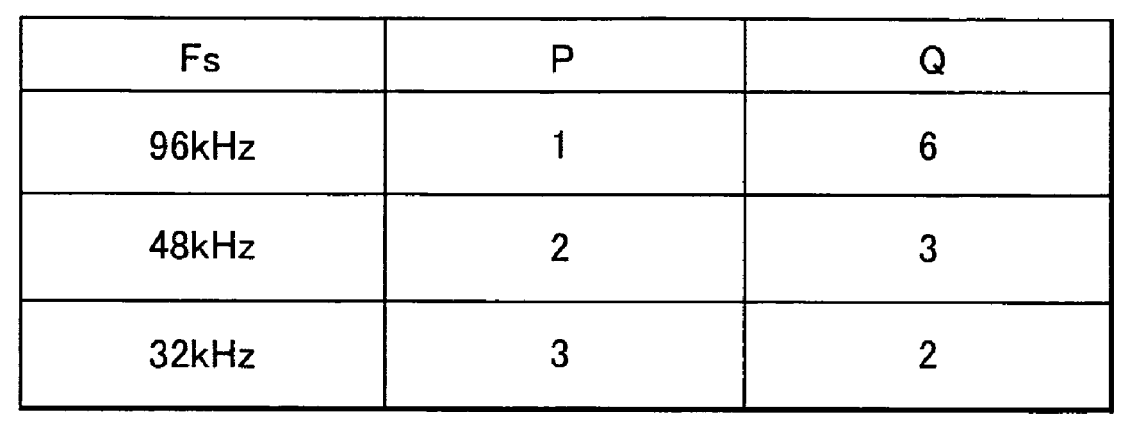

FIG. 3 shows the values of P, Q, and Fs based on the example of numeric values. By selecting Fs, P, and Q in this way, Fo and Fm can be kept constant even if Fs changes.

In other words, when Fs is 96 kHz, P is set to 1 and Q is set to 6. When Fs is 48 kHz, P is set to 2 and Q is set to 3. When Fs is 32 kHz, P is set to 3 and Q is set to 2.

Although the Fs decoder 32 generates division ratio information, P and Q, from the Fs information that is the sampling frequency information in this preferred embodiment, it is also possible to directly send P and Q instead of sending the Fs information from the transmission apparatus 10.

Next, with reference to the flowchart in FIG. 4, the transmission processing of the transmission apparatus 1 will be described. In step S1, the Fs selection unit 12 selects one of audio sampling frequencies Fs, 96 kHz, 48 kHz, and 32 kHz, to be used based on an instruction from the user. In step S2, the PLL unit 11 generates the pixel clock and, at the same time, generates the audio clock in synchronization with the pixel clock. In step S3, the video signal processing unit 14 processes the video signal based on the pixel clock generated by the PLL unit 11 and outputs the signal as digital video data. In step S4, the audio signal processing unit 13 processes the audio signal based on the audio clock generated by the PLL unit 11 and outputs the signal as digital audio data.

In step S5, the modulation unit 15 modulates the digital video data output from the video signal processing unit 14, the digital audio data output from the audio signal processing unit 13, the pixel clock output from the PLL unit 11, and the Fs information output from the Fs selection unit 12 and sends them to the reception apparatus 2 via the cable 3.

Next, with reference to the flowchart in FIG. 5, the reception processing of the reception apparatus 2 will be described. In step S21, the demodulation unit 31 demodulates the signals received from the transmission apparatus 1 via the cable 3 and extracts the digital video data, the digital audio data, the pixel clock, and the Fs information. In step S22, the Fs decoder 32 generates P and Q, which is division ratio information to be supplied to the variable divider 55 and the variable divider 56, based on the Fs information output from the demodulation unit 31 and outputs them to the audio PLL unit 33. In other words, as shown in FIG. 3, when the Fs information indicates 96 kHz, P is set to 1 and Q is set to 6. When the Fs information indicates 48 kHz, P is set to 2 and Q is set to 3 and, when the Fs information indicates 32 kHz, P is set to 3 and Q is set to 2.

In step S23, the audio PLL unit 33 divides the pixel clock, supplied from the demodulation unit 31, based on the division ratio information P and Q supplied from the Fs decoder 32 and reproduces the audio clock. The detail of the processing will be described later with reference to the flowchart in FIG. 6.

In step S24, the video signal processing unit 34 processes the video data, supplied from the demodulation unit 31, based on the pixel clock supplied also from the demodulation unit 31. In step S25, the audio signal processing unit 35 processes the audio data, supplied from the demodulation unit 31, based on the audio clock supplied from the audio PLL unit 33.

Next, with reference to the flowchart in FIG. 6, the audio clock reproduction processing of the audio PLL unit 33 will be described. In step S31, the divider 51 divides the pixel clock supplied from the demodulation unit 31 and outputs the reference frequency signal Fr. In step S32, the phase comparator 52 compares the phase of the reference frequency signal Fr output from the divider 51 with the phase of the comparison frequency signal Fc output from the divider 57 and outputs the phase error signal. In step S33, the loop filter unit 53 smoothes the error signal output from the phase comparator and outputs the control voltage of the VCO unit 54. In step S34, the VCO unit 54 outputs the signal Fo of a constant frequency controlled based on the loop filter unit 53.

In step S35, the variable divider 55 divides the signal Fo of a constant frequency, output from the VCO unit 54, based on the division ratio information P supplied from the Fs decoder 32 and outputs the audio clock 384Fs. In step S36, the variable divider 56 divides the audio clock 384Fs, output from the variable divider 55, based on the division ratio information Q supplied from the Fs decoder 32 and outputs the signal Fm of a constant frequency. In step S37, the divider 57 divides the signal Fm of a constant frequency, which is output from the variable divider 56, and outputs the comparison frequency signal Fc to the phase comparator 52.

The operation of the audio PLL unit 33 described above will be described in more detail using an example of actual numeric values. When the pixel clock is 27 MHz and the division ratio (fixed) of the divider 51 is 27000, the output of the variable divider 51, in other words, the frequency of the reference frequency signal Fr, is 1 kHz (=27000 kHz/27000). When the frequency of the signal Fo generated by the VCO unit 54 is 36.864 MHz and the sampling frequency Fs is 96 kHz, the division ratio P of the variable divider 55 is set to 1 as shown in FIG. 3 and the frequency of the output signal of the variable divider 55 is set to 36.864 MHz (=384.times.96 kHz). The division ratio Q of the variable divider 56 is set to 6, and the frequency Fm of the output signal of the variable divider 56 is set to 6.144 MHz (=36.864 MHz/6). When the division ratio (fixed) of the divider 57 is 6144, the frequency of the comparison frequency signal Fc is 1 kHz (=6144 kHz/6144) that is equal to the frequency of the reference frequency signal Fr.

In addition, if the sampling frequency Fs is 48 kHz, the division ratio P of the variable divider 55 is set to 2 as shown in FIG. 3 and the frequency of the output signal of the variable divider 55 is 18.432 MHz (=36.864 MHz/2=384×48 kHz). The division ratio Q of the variable divider 56 is set to 3, and the frequency Fm of the output signal of the variable divider 56 is set also to 6.144 MHz (=18.432 MHz/3).

Furthermore, when the sampling frequency Fs is 32 kHz, the division ratio P of the variable divider 55 is set to 3 as shown in FIG. 3 and the frequency of the output signal of the variable divider 55 is 12.288 MHz (=36.864 MHz/3=384×32 kHz). The division ratio Q of the variable divider 56 is set to 2 and the frequency Fm of the output signal of the variable divider 56 is set also to 6.144 MHz (=12.288 MHz/2).

As described above, even when the value of the sampling frequency Fs changes, the frequency Fo of the output signal of the VCO unit 54 and the frequency Fm of the output signal of the variable divider 56 remain unchanged and, as a result, the frequency of the comparison frequency signal Fc is kept constant.

By the way, although the number of audio clock frequencies is three in the above description, the present invention may also be applied when the number of audio clock frequencies is two or four, or more.

As described above, the common VCO can be used in the receiving side even if the sampling frequency changes in the transmitting side. In addition, even if the sampling frequency changes in the transmitting side, the frequency of the comparison signal can be kept constant in the receiving side. For example, when video digital data and audio digital data are transmitted at the same time, a relatively inexpensive, small system can be built that allows the receiving side to reproduce the audio reference clock from the video reference clock. This eliminates the need of transmitting the audio reference clock, thus increasing the transmission efficiency.

It should be noted that the steps for executing the sequence of processing described above in this specification include not only processing executed chronologically according to the order in which the steps are described but also processing not necessarily executed chronologically but sometimes executed in parallel or individually.

Although an example of the processing of the video signal and the audio signal is described above, the present invention may also be applicable to the processing of other signals.

INDUSTRIAL APPLICABILITY

As described above, according to a first embodiment of the present invention, a system may be realized in which a reception apparatus can generate a first clock of a plurality of different frequencies. In particular, it is possible to implement a simply structured, inexpensive, small scaled system.

According to a second embodiment of the present invention, a transmission apparatus may be realized that allows a reception apparatus to generate a first clock of a plurality of different frequencies. In particular, it is possible to implement a transmission apparatus that makes the reception apparatus simply structured, inexpensive, and small.

According to a third embodiment of the present invention, a first clock of a plurality of different frequencies may be generated. In particular, it is possible to generate such a clock without making the configuration complex, large, and expensive.

The invention claimed is:

1. A digital signal transmission system comprising a transmission apparatus and a reception apparatus, the digital signal transmission system wherein the transmission apparatus comprises:

clock generating means for generating a first clock and a second clock;

frequency information outputting means for outputting frequency information related to a frequency of the first clock;

first signal processing means for processing a first signal and outputting a first digital signal based on the first clock generated by the clock generating means;

second signal processing means for processing a second signal and outputting a second digital signal based on the second clock generated by the clock generating means; and transmitting means for transmitting the second clock generated by the clock generating means, the frequency information output by the frequency information outputting means, the first digital signal output by the first signal processing means, and the second digital signal output by the second signal processing means; and the reception apparatus comprises:
receiving means for receiving the signals transmitted by the transmitting means;
division ratio information generating means for generating division ratio information, which represents a division ratio, based on the frequency information extracted from the signals received by the receiving means; and
clock reproducing means for reproducing the first clock based on the second clock extracted from the signals received by the receiving means and the division ratio information;
wherein
the clock reproducing means generates a signal of a comparative frequency by dividing a signal of given frequency, the signal of given frequency generated based on a result of comparison of phase of a signal of reference frequency with the signal of comparative frequency, wherein the signal of reference frequency is generated by dividing the second clock.

2. A digital signal transmission method for a digital signal transmission system comprising a transmission apparatus and a reception apparatus, the digital signal transmission method wherein
a transmission method of the transmission apparatus comprises:
a clock generating step of generating a first clock and a second clock;
a frequency information outputting step of outputting frequency information related to a frequency of the first clock;
a first signal processing step of processing a first signal and outputting a first digital signal based on the first clock generated by the processing of the clock generating step;
a second signal processing step of processing a second signal and outputting a second digital signal based on the second clock generated by the processing of the clock generating step; and
a transmitting step of transmitting the second clock generated by the processing of the clock generating step, the frequency information output by the processing of the frequency information outputting step, the first digital signal output by the processing of the first signal processing step, and the second digital signal output by the processing of the second signal processing step; and
a reception method of the reception apparatus comprises:
a receiving step of receiving the signals sent by the processing of the transmitting step;
a division ratio information generating step of generating division ratio information, which represents a division ratio, based on the frequency information extracted from the signals received by the processing of the receiving step; and
a clock reproducing step of reproducing the first clock based on the second clock extracted from the signals received by the processing of the receiving step and the division ratio information;
wherein
in the clock reproducing step, a signal of a comparative frequency is generated by dividing a signal of given frequency, the signal of given frequency generated based on a result of comparison of phase of a signal of reference frequency with the signal of comparative frequency, wherein the signal of reference frequency is generated by dividing the second clock.

3. A transmission apparatus for transmitting a first digital signal and a second digital signal, the transmission apparatus comprising:
clock generating means for generating a first clock and a second clock;
frequency information outputting means for outputting frequency information related to a frequency of the first clock;
first signal processing means for processing a first signal and outputting the first digital signal based on the first clock generated by the clock generating means;
second signal processing means for processing a second signal and outputting the second digital signal based on the second clock generated by the clock generating means; and
transmitting means for transmitting the second clock generated by the clock generating means, the frequency information output by the frequency information outputting means, the first digital signal output by the first signal processing means, and the second digital signal output by the second signal processing means.

4. A transmission method for a transmission apparatus that transmits a first digital signal and a second digital signal, the transmission method comprising:
a clock generating step of generating a first clock and a second clock;
a frequency information outputting step of outputting frequency information related to a frequency of the first clock;
a first signal processing step of processing a first signal and outputting the first digital signal based on the first clock generated by the processing of the clock generating step;
a second signal processing step of processing a second signal and outputting the second digital signal based on the second clock generated by the processing of the clock generating step; and
a transmitting step of transmitting the second clock generated by the processing of the clock generating step, the frequency information output by the processing of the frequency information outputting step, the first digital signal output by the processing of the first signal processing step, and the second digital signal output by the processing of the second signal processing step.

5. A reception apparatus for receiving a first digital signal and a second digital signal, the reception apparatus comprising:
receiving means for receiving the first digital signal, the second digital signal, the frequency information related to a first clock, and a signal including a second clock, all of which transmitted from a transmission apparatus;
division ratio information generating means for generating division ratio information, which represents a division ratio, based on the frequency information extracted from the signals received by the receiving means; and
clock reproducing means for reproducing the first clock based on the second clock received by the receiving means and the division ratio information generated by the division ratio information generating means, wherein said division ratio information includes a plurality of division ratios; wherein
the clock reproducing means generates a signal of a comparative frequency by dividing a signal of given frequency by said plurality of division ratios, the signal of given frequency generated based on a result of comparison of phase of a signal of reference frequency with the signal of comparative frequency, wherein the signal of reference frequency is generated by dividing the second clock.

6. The reception apparatus according to claim 5 wherein the clock reproducing means further comprises:
- a first dividing means for dividing the second clock extracted from a signal received by the receiving means by a first division ratio and generating a signal of a reference frequency;
- phase comparing means for comparing a phase of the signal of the reference frequency generated by the first dividing means, with a phase of a signal of a comparison frequency, and outputting a phase error signal;
- smoothing means for smoothing the error signal output by the phase comparing means;
- oscillating means for generating a signal of a constant frequency controlled based on an output from the smoothing means;
- a second dividing means for dividing the generated signal of a constant frequency by a second division ratio based on the division ratio information generated by the division ratio generating means;
- a third dividing means for dividing the signal generated by the second dividing means, by a third division ratio based on the division ratio information generated by the division ratio information generating means; and
- a fourth dividing means for dividing the signal generated by the third dividing means, by a fourth division ratio and generating the signal of a comparison frequency.

7. A reception method for a reception apparatus that receives a first digital signal and a second digital signal, the reception method comprising:
- a receiving step of receiving the first digital signal, the second digital signal, frequency information related to a first clock, and a signal including a second clock, all of which transmitted from a transmission apparatus;
- a division ratio information generating step of generating division ratio information, which represents a division ratio, based on the frequency information extracted from the signals received by the processing of the receiving step; and
- a clock reproducing step of reproducing the first clock based on the second clock received by the processing of the receiving step and the division ratio information generated by the processing of the division ratio information generating step, wherein said generated division ratio information includes a plurality of division ratios; wherein in the clock reproducing step, a signal of a comparative frequency is generated by dividing a signal of given frequency by said plurality of division ratios, the signal of given frequency generated based on a result of comparison of phase of a signal of reference frequency with the signal of comparative frequency, wherein the signal of reference frequency is generated by dividing the second clock.

8. The reception method according to claim 7 wherein the clock reproducing step further comprises:
- a first dividing step of dividing the second clock extracted from a signal received by the processing of the receiving step, by a first division ratio and generating a signal of a reference frequency;
- a phase comparing step of comparing a phase of the signal of the reference frequency generated by the processing of the first dividing step, with a phase of a signal of a comparison frequency and generating a phase error signal;
- a smoothing step of smoothing the error signal generated by the processing of the phase comparing step;
- an oscillating step of generating a signal of a constant frequency based on the signal smoothed by the processing of the smoothing step;
- a second dividing step of dividing the generated signal of a constant frequency, by a second division ratio based on the division ratio information generated by the processing of the division ratio generating step;
- a third dividing step of dividing the signal, generated by the processing of the second dividing step, by a third division ratio based on the division ratio information generated by the processing of the division ratio generating step; and
- a fourth dividing step of dividing the signal, generated by the processing of the third dividing step, by a fourth division ratio and generating the signal of a comparison frequency.

* * * * *